United States Patent
Ho et al.

(10) Patent No.: US 7,755,153 B2
(45) Date of Patent: Jul. 13, 2010

(54) STRUCTURE AND METHOD FOR A MAGNETIC MEMORY DEVICE WITH PROXIMITY WRITING

(75) Inventors: ChiaHua Ho, Kaohslung (TW); Kuang Yeu Hsieh, Hsinchu (TW)

(73) Assignee: Macronix International Co. Ltd. (TW)

( * ) Notice: Subject to any disclaimer, the term of this patent is extended or adjusted under 35 U.S.C. 154(b) by 386 days.

(21) Appl. No.: 11/332,748

(22) Filed: Jan. 13, 2006

(65) Prior Publication Data
US 2007/0164381 A1 Jul. 19, 2007

(51) Int. Cl.
*H01L 43/00* (2006.01)
(52) U.S. Cl. .................................................. 257/421
(58) Field of Classification Search ................ 257/108, 257/295, 421, E21.662, E43.001–E43.007, 257/E27.005–E27.006, E27.008, E29.164, 257/E29.167, E29.272, E29.323, E27.104, 257/E21.208, E21.663–E21.665, E21.436; 365/8, 158, 164, 171; 438/3, E21.208
See application file for complete search history.

(56) References Cited

U.S. PATENT DOCUMENTS

| | | | |
|---|---|---|---|
| 5,640,343 A | 6/1997 | Gallagher et al. | |
| 6,034,887 A * | 3/2000 | Gupta et al. | 365/171 |
| 6,174,737 B1 * | 1/2001 | Durlam et al. | 438/3 |
| 6,473,336 B1 * | 10/2002 | Nakajima et al. | 365/171 |
| 6,545,906 B1 | 4/2003 | Savtchenko et al. | |
| 6,590,803 B2 * | 7/2003 | Saito et al. | 365/158 |
| 6,606,263 B1 * | 8/2003 | Tang | 365/158 |
| 6,730,949 B2 * | 5/2004 | Kishi et al. | 257/295 |
| 6,785,160 B1 * | 8/2004 | Sharma et al. | 365/158 |
| 6,845,038 B1 * | 1/2005 | Shukh | 365/171 |
| 6,879,515 B2 * | 4/2005 | Yoda et al. | 365/158 |
| 6,888,753 B2 * | 5/2005 | Kakoschke et al. | 365/185.11 |
| 6,949,779 B2 * | 9/2005 | Kai et al. | 257/295 |
| 7,068,537 B2 * | 6/2006 | Hiebert et al. | 365/171 |
| 7,075,818 B2 * | 7/2006 | Ju | 365/158 |
| 7,224,601 B2 * | 5/2007 | Panchula | 365/158 |
| 2002/0167059 A1 * | 11/2002 | Nishimura et al. | 257/421 |
| 2003/0218197 A1 * | 11/2003 | Jang et al. | 257/295 |
| 2004/0076035 A1 * | 4/2004 | Saito et al. | 365/158 |
| 2004/0213040 A1 * | 10/2004 | Oh et al. | 365/158 |
| 2005/0230771 A1 * | 10/2005 | Ha et al. | 257/421 |
| 2006/0028862 A1 * | 2/2006 | Min et al. | 365/158 |

* cited by examiner

*Primary Examiner*—Dao H Nguyen
*Assistant Examiner*—Tram H Nguyen
(74) *Attorney, Agent, or Firm*—Baker & McKenzie LLP

(57) ABSTRACT

An MRAM device comprises a plurality of MRAM structures, each MRAM structure comprising a magnetoresistive memory cell in close proximity to a high permeability conductive line and a single transistor configured to access the magnetoresistive memory cell for both read and write operations. The high permeability conductive line acts a current path for both read and write operations, thereby reducing the number of metal bit lines.

21 Claims, 16 Drawing Sheets

STRUCTURE AND METHOD FOR A MAGNETIC MEMORY DEVICE WITH PROXIMITY WRITING

RELATED APPLICATION INFORMATION

This application is related to co-pending U.S. patent application Ser. No. 11/255,606, entitled, "A Magnetic Memory Device and Methods for Making a Magnetic Memory Device," filed Oct. 21, 2005, U.S. patent application Ser. No. 11/281,658, entitled, "Systems and Methods for Reading and Writing a Magnetic Memory Device," filed Nov. 17, 2005, U.S. patent application Ser. No. 11/281,027, entitled "Systems and Methods For a Magnetic Memory Device That Includes a Single Word line Transistor," filed Nov. 17, 2005, and U.S. patent application Ser. No. 11/281,018, entitled, "Systems and Methods for a Magnetic Memory Device Comprising Two Word Line Transistor," filed Nov. 17, 2005, each of which are incorporated herein in the entirety as if set forth in full.

BACKGROUND

1. Field of the Invention

The invention relates in general to memory devices for use as computer main storage, and in particular to memory arrays that use magnetic memory elements as the individual memory cells.

2. Background of the Invention

The desired characteristics of a memory cell for computer main memory are high speed, low power, nonvolatility, and low cost. Low cost is accomplished by a simple fabrication process and a small surface area. Dynamic random access memory (DRAM) cells are fast and expend little power, but have to be refreshed many times each second and require complex structures to incorporate a capacitor in each cell. Flash type EEPROM cells are nonvolatile, have low sensing power, and can be constructed as a single device, but take microseconds to write and milliseconds to erase, which makes them too slow for many applications, especially for use in computer main memory. Conventional semiconductor memory cells such as DRAM, ROM, and EEPROM have current flow in the plane of the cell, i.e., "horizontal", and therefore occupy a total surface area that is the sum of the essential memory cell area plus the area for the electrical contact regions, and therefore do not achieve the theoretical minimum cell area.

Unlike DRAM, magnetic memory cells that store information as the orientation of magnetization of a ferromagnetic region can hold stored information for long periods of time, and are thus nonvolatile. Certain types of magnetic memory cells that use the magnetic state to alter the electrical resistance of the materials near the ferromagnetic region are collectively known as magnetoresistive (MR) memory cells. An array of magnetic memory cells is often called magnetic RAM or MRAM.

To be commercially practical MRAM should have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, three problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and error rate of the MRAM device and unintended reversals can occur due to thermofluctuations (superparamagnetism) if the barrier is too small. A major problem with having a small energy barrier is that it becomes extremely difficult to selectively switch one MRAM device in an array. Selectablility allows switching without inadvertently switching other MRAM devices. Finally, because the switching field is produced by shape, the switching field becomes more sensitive to shape variations as the MRAM device decreases in size. With photolithography scaling becoming more difficult at smaller dimensions, MRAM devices will have difficulty maintaining tight switching distributions.

These problems often associated with conventional MRAM devices result in other problems. For example, it takes high currents in order to change the state of the magnetic sensing device in order to program a conventional MRAM device. These high currents create several problems including high power consumption which makes MRAM devices unsuitable for many portable applications. Moreover, the magnetic field resulting from the currents is often difficult to control which leads to cross talk problems especially in MRAM devices with decreased lateral dimensions as described above.

Another problem with conventional MRAM devices is that two current lines are typically required for generating the currents and associated magnetic field needed to program the magnetic sensing device included in the MRAM device. The inclusion of two current lines limits the ability to shrink the MRAM device and achieve the greatest possible densities in size reductions.

SUMMARY

An MRAM device comprises a plurality of MRAM structures, each MRAM structure comprising a magnetoresistive memory cell in close proximity to a high permeability conductive line and a single transistor configured to access the magnetoresistive memory cell for both read and write operations.

In one aspect, the high permeability conductive line acts a current path for both read and write operations, thereby reducing the number of metal bit lines.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

Figure 1:
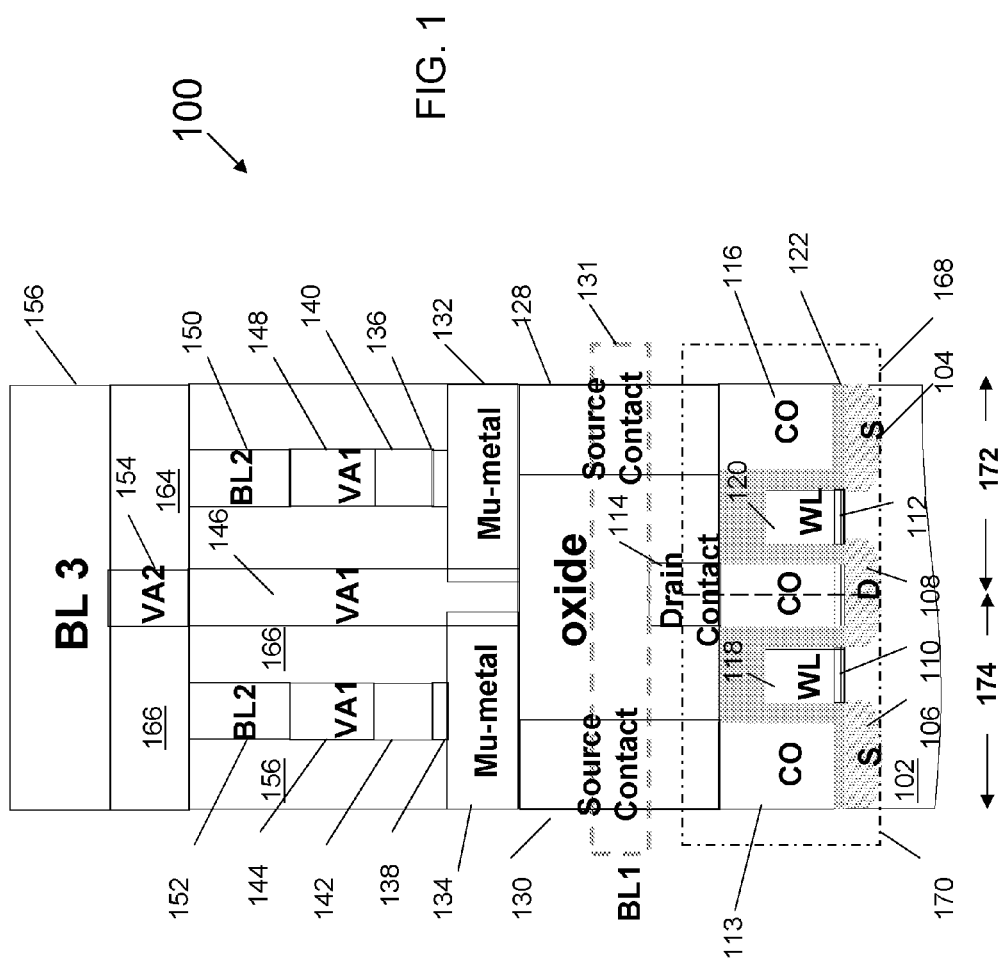
FIG. 1 is a diagram illustrating an example MRAM device comprising two MRAM structures in accordance with one embodiment.

FIG. 1 is a diagram illustrating an example embodiment of an MRAM device 100 comprising two MRAM structures 172 and 174 configured in accordance with the systems and methods described herein. It will apparent that MRAM device 100 can comprise more than two MRAM structures and that two MRAM structures are shown by way of convenience only. Each of structure 172 and 174 comprise a magnetoresistive memory cell 140 and 142 in close proximity to a relatively high permeability conductive lines 132 and 134, respectively.

Methods for programming the state of a magnetoresistive memory cell, such as cells 140 and 142, via a magnetic field generated in a high permeability conductive line, such as lines 132 and 134, are described in detail in co-pending patent application Ser. No. 11/255,606. Methods for performing reading and writing operations within an MRAM device that includes a magnetoresistive memory cell in proximity to a high permeability conductive line are described in co-pending patent application Ser. No. 11/281,658.

As mentioned in the Ser. No. 11/281,658 application, and as will be described in more detail below, high permeability conductive lines 132 and 134 can be used to conduct currents that create magnetic fields that can be used to program magnetoresistive memory cells 140 and 142, respectively, to one of two states. Further, high permeability conductive lines 132 and 134 can be used to conduct currents that enable the determination of the state of magnetoresistive memory cells 140 and 142, respectively. By using high permeability conductive lines 132 and 134 to conduct read and write currents in this manner, lower current levels can be used in the read and write operations as compared to conventional devices. Further, the low currents in high permeability conductive lines 132 and 134 reduce, and can even eliminate cross talk problems that can effect conventional MRAM devices. The number of metal bit lines can also be reduced relative to conventional MRAM devices, which allows for greater reduction in size and increase densities and even lower the cost of product.

Figure 2:
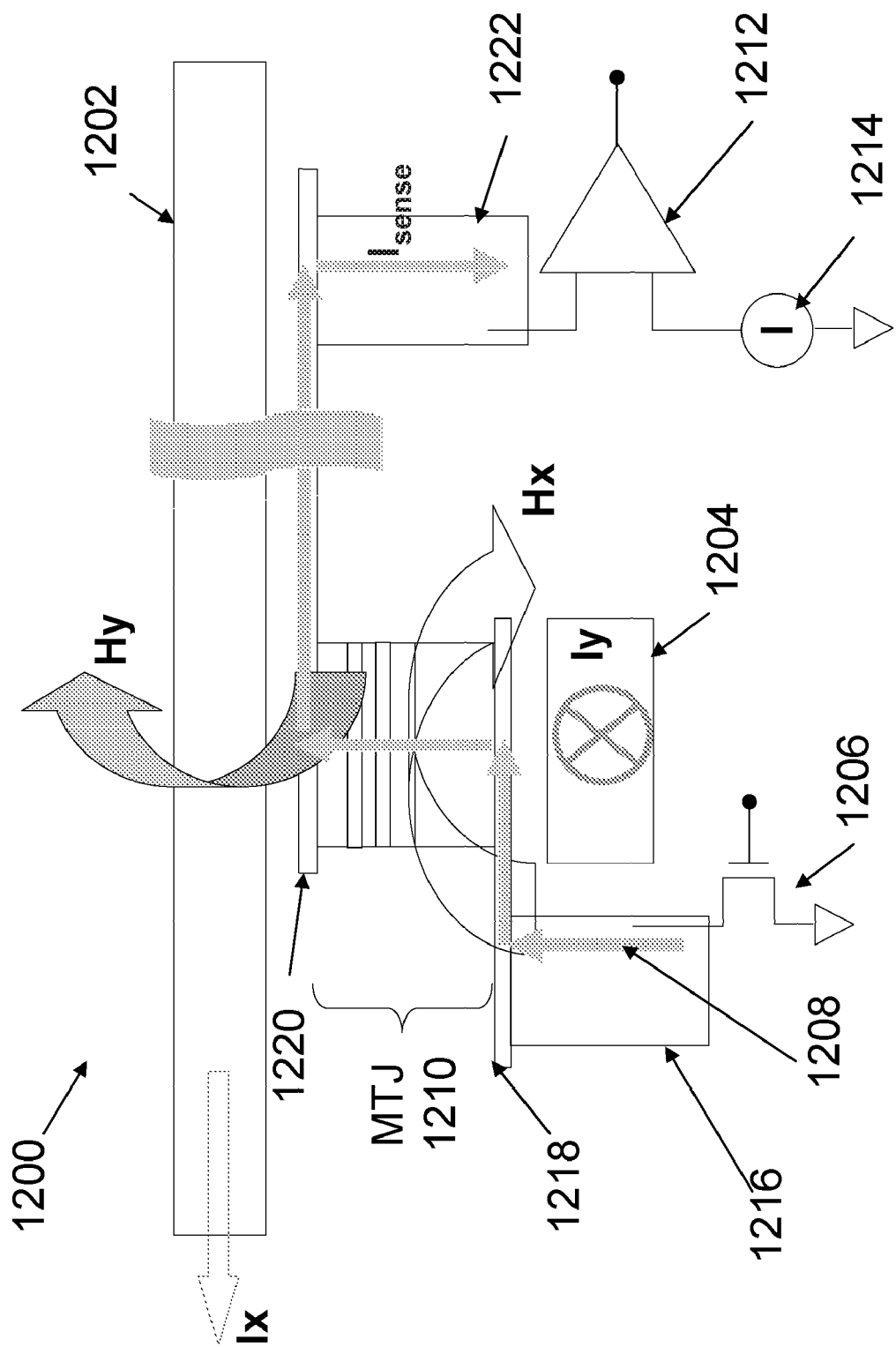
FIG. 2 is a diagram illustrating the read and write operation of a conventional MRAM device.
Figure 12:
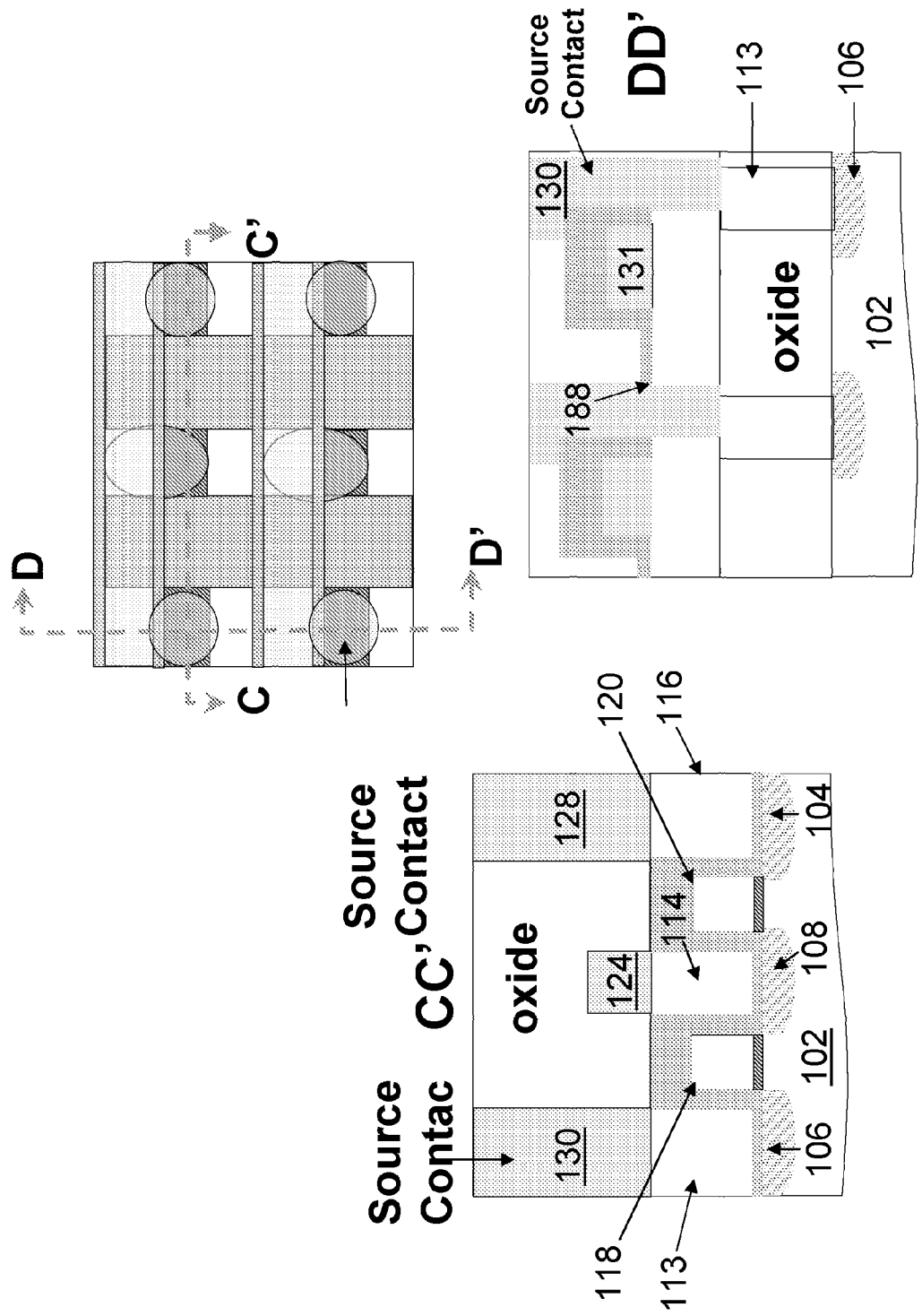

As illustrated in FIG. 12 of the 11/281,658 application, a conventional MRAM device includes separate read and write current paths. This requires multiple metal bit lines. FIG. 12 of the 11/281,658 application is reproduced herein as FIG. 2. FIG. 2 illustrates the read and write operation of a conventional MRAM device 1200. In order to read the state of magnetic sensing device 1210, a word line transistor 1206 and current sense amplifier 1212 are required. When word line transistor 1206 is turned on, a current 1208 flows up through the cell and through magnetic sensing device 1210 and then down to current sense amplifier 1212, which can be configured to determine the programming state of magnetic sensing device 1210 based on the value of current 1208. As can be seen, read current 1208 flows through a different path than writing currents Ix and Iy flowing in current lines 1202 and 1204. Additionally, several layers 1216, 1218, 1220, and 1222 are needed within cell 1200 in order to provide a current path for current 1208 to flow through transistor 1206 and into current sensing amplifier 1212.

Moreover, in order to effectively program the state of magnetic sensing device 1210, very high currents Ix and Iy of the order of magnitude of 1 mA~10 mA must be generated in bit lines 1202 and 1204. Conversely, as explained in FIGS. 9-11 of the Ser. No. 11/281,658 application, an MRAM device configured in accordance with the systems and methods described therein can use a high permeability conductive line to both read and write the state of magnetoresistive memory cell, thus reducing the number of metal conducting lines as compared to a conventional MRAM device.

Figure 3:
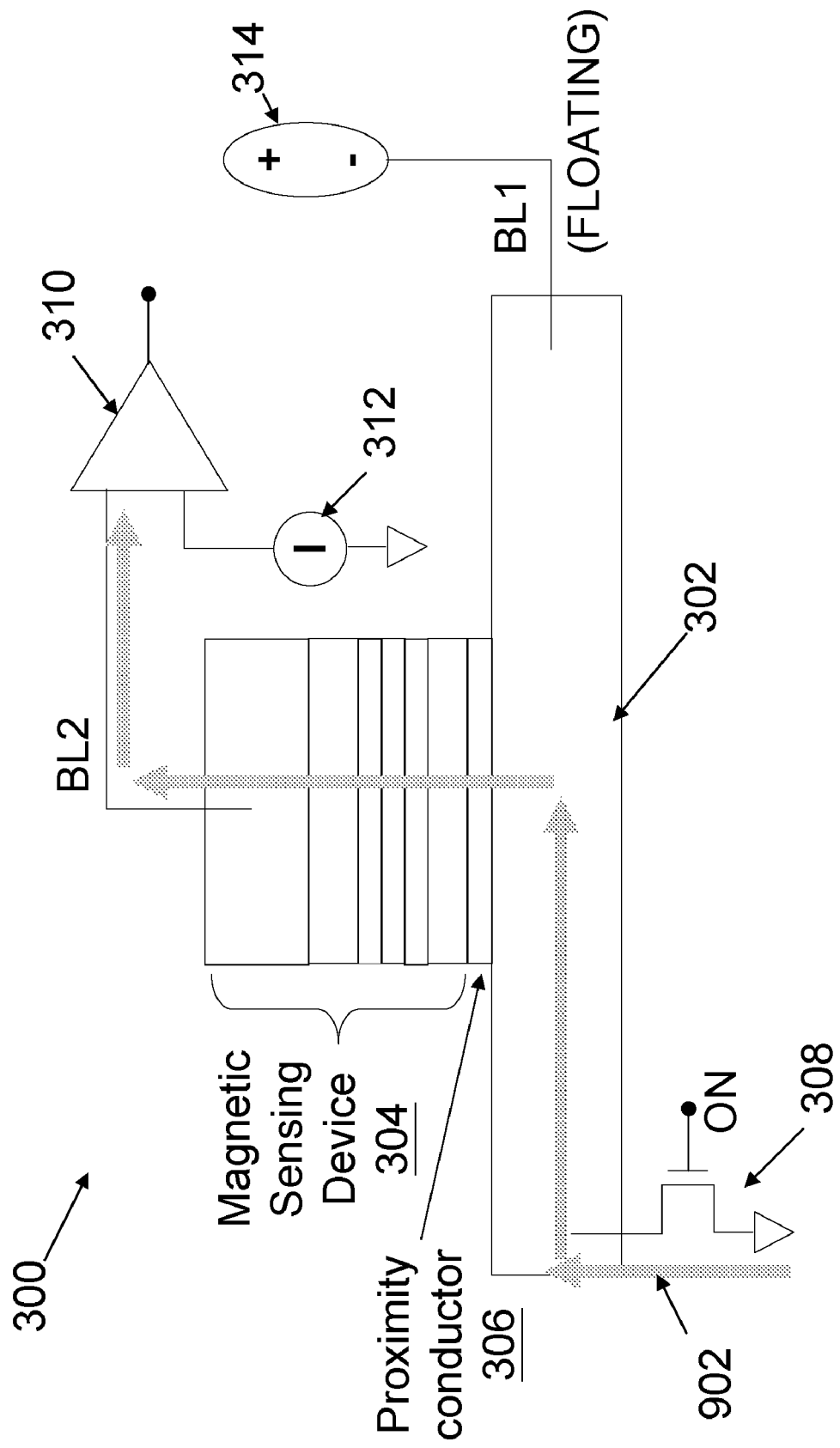
FIG. 3 is a diagram illustrating how the state of magnetoresistive memory cell can be read for an MRAM device configured in accordance with one embodiment.
Figure 9:
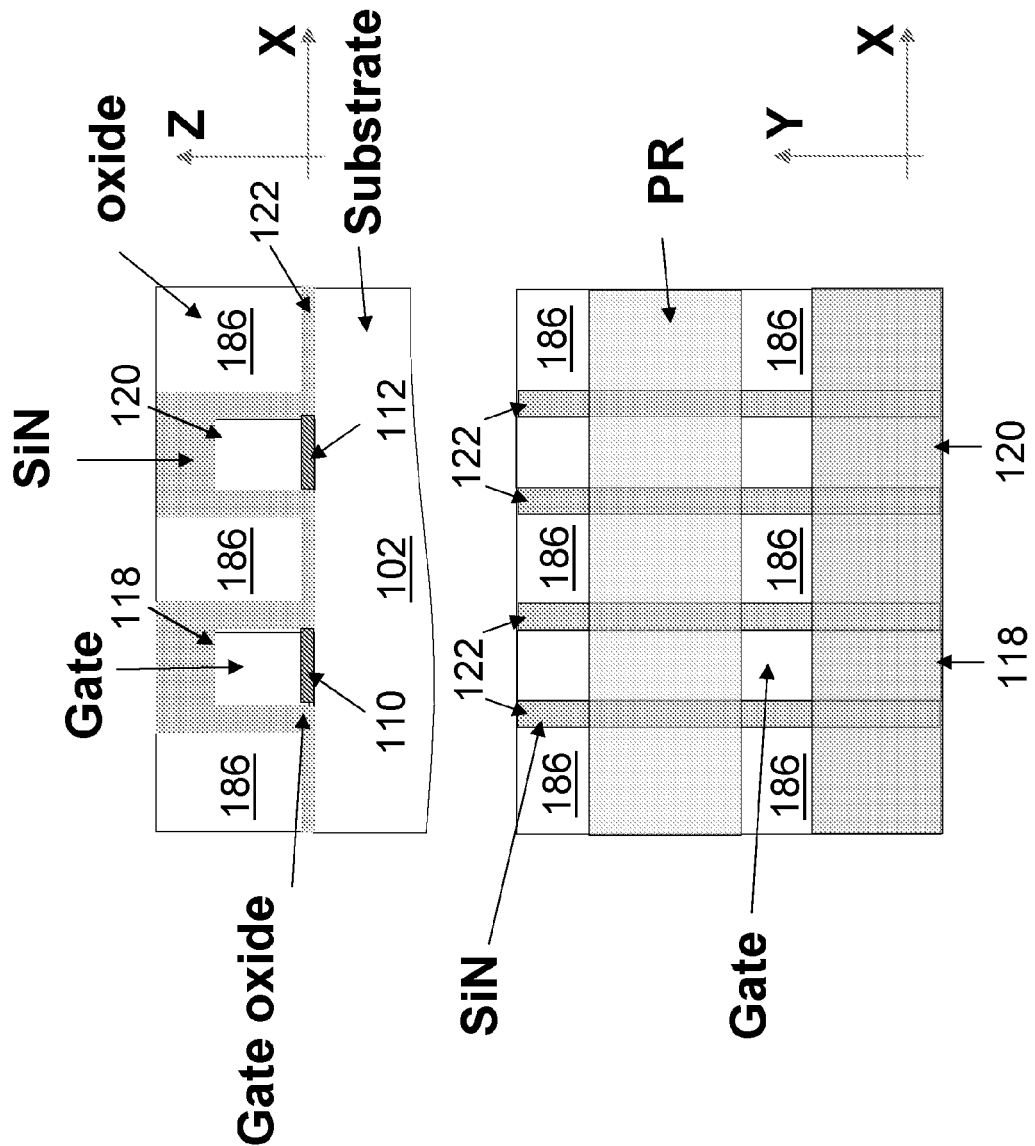
FIGS. 9-16 are diagrams illustrating an example process for fabricating the MRAM device of FIG. 1 in accordance with one embodiment.
Figure 10:
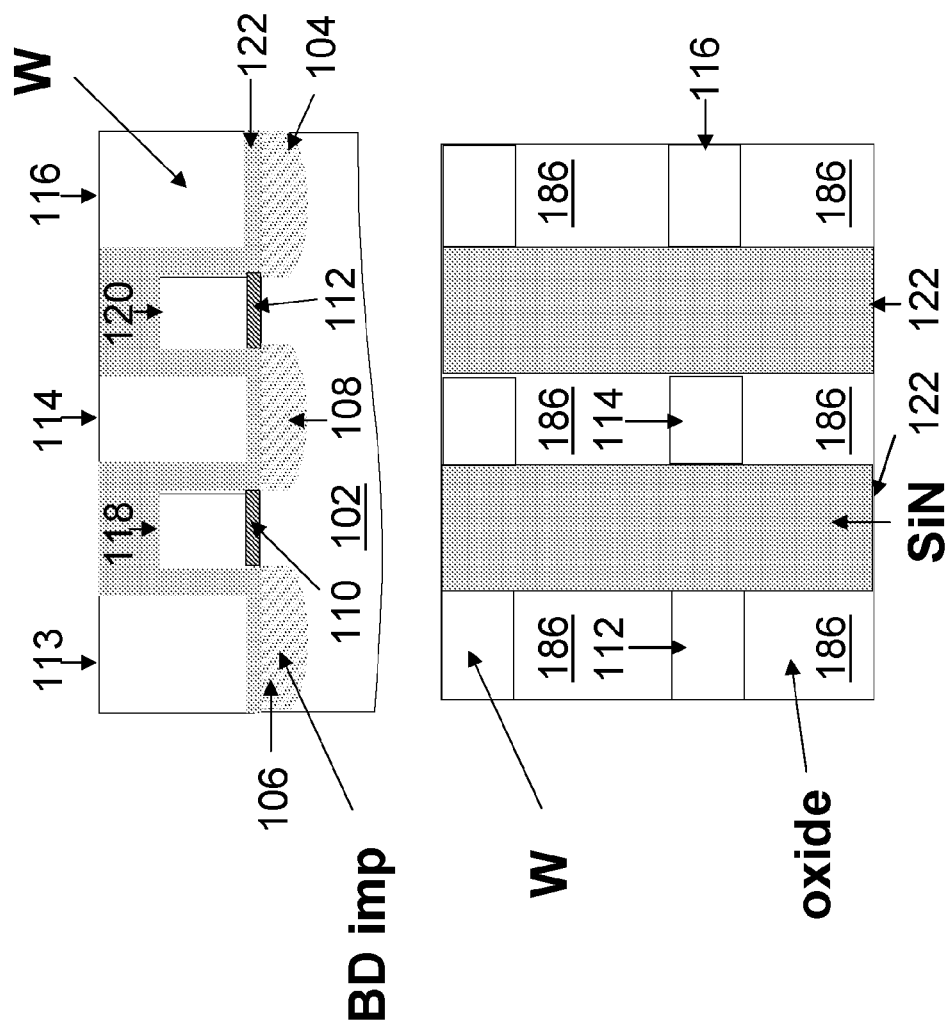
Figure 11:
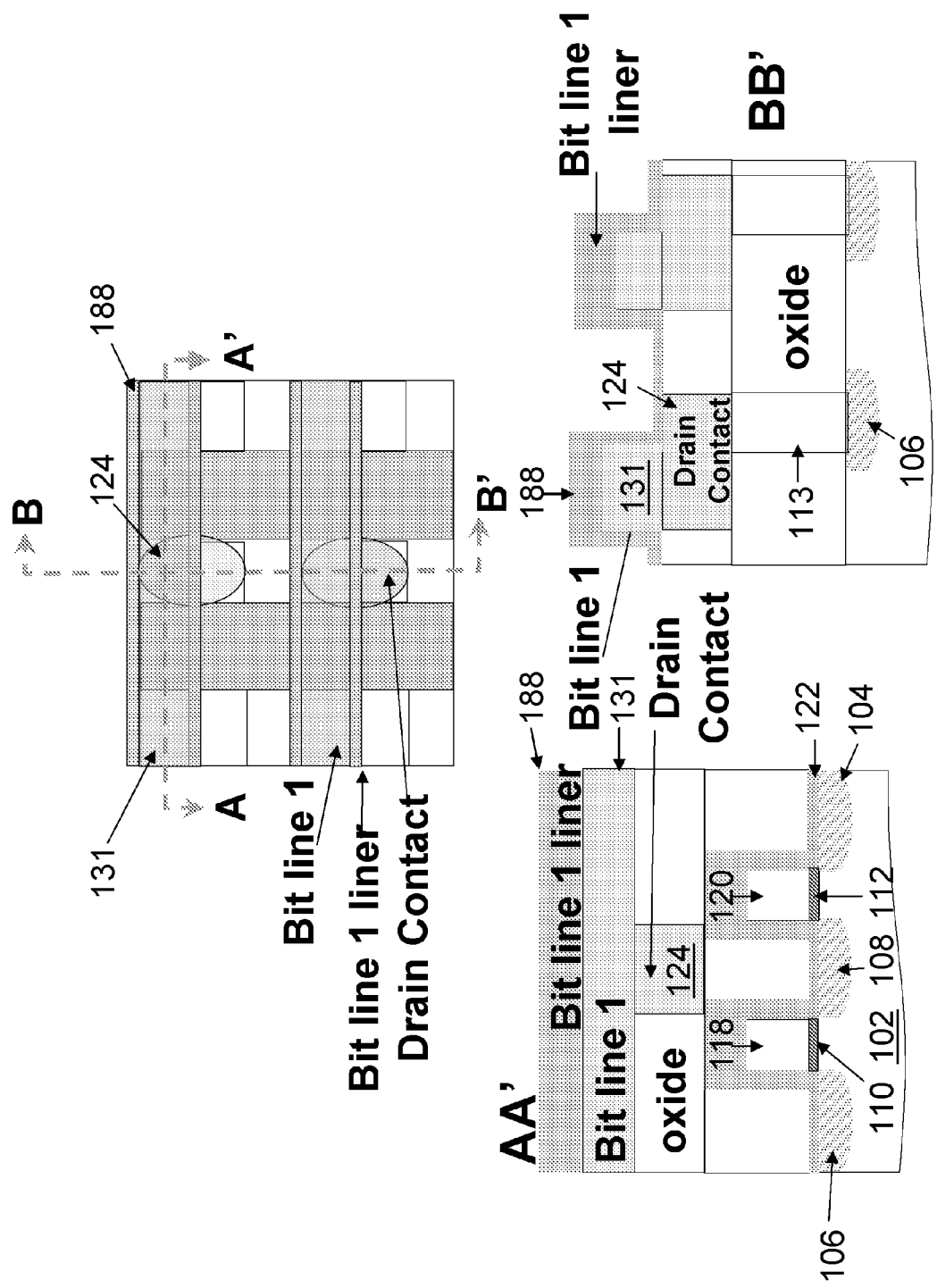

FIGS. 9-11 of the Ser. No. 11/281,658 application are reproduced herein as FIGS. 3-5. FIG. 3 is a diagram illustrating how the state of magnetoresistive memory cell 304 can be read for a MRAM device 300 in accordance with one embodiment in the systems and methods described herein. Here, a turn on voltage can be applied to the gate of word line transistor 308, such as a 1.6 volt turn on voltage. A voltage difference can then be applied to high permeability conductive line 302 and magnetoresistive memory cell 304. This will cause a current 902 to flow through word line transistor 308 into high permeability conductive line 302 and up into magnetoresistive memory cell 304 as illustrated. The current can then flow through BL2 and into sense amplifier 310, which can be configured to sense the state of magnetic sensing device 304. Sense amplifier 310 is configured to compare the current on BL2 to a reference current 312. By sensing the difference between the current on BL2 relative to reference current 312, sense amplifier 310 can be configured to distinguish the logic state of magnetoresistive memory cell 304. BL1 can be left floating during this read operation.

Figure 4:
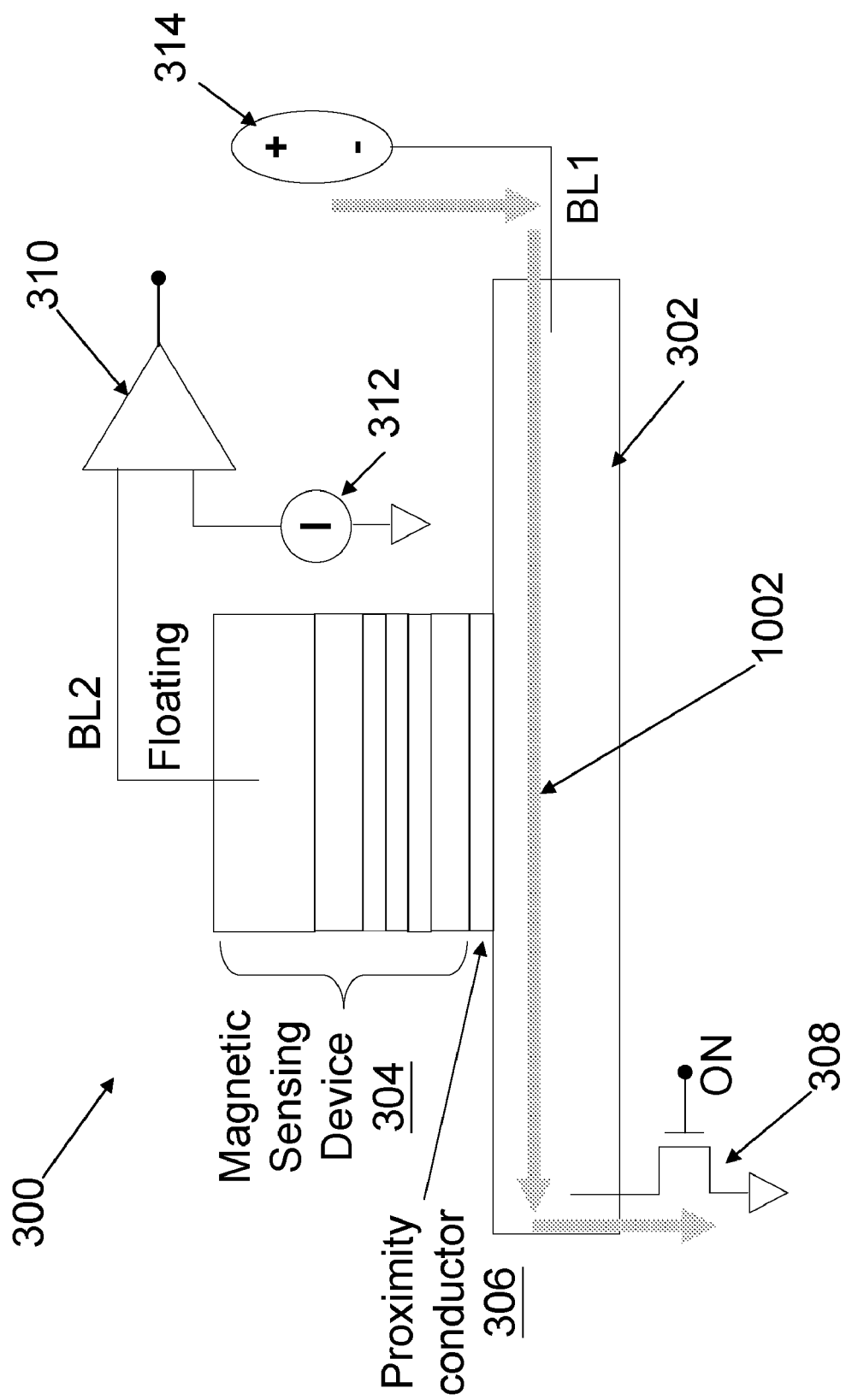
FIG. 4 is a diagram illustrating a write operation in which magnetoresistive memory cell is programmed to one of two programming states in accordance with one embodiment.

FIG. 4 is a diagram illustrating a write operation in which magnetoresistive memory cell 304 is programmed to one of two programming states in accordance with one embodiment of the systems and methods described herein. Here, a turn on voltage, e.g., of 1.6 volts, can be applied to word line transistor 308 turning it on. A voltage difference is then applied to the other side of high permeability conductive line 302 via BL1. This causes a writing current 1002 to flow from BL1 through magnetic metal layer 302 to word line transistor 308. Current 1002 will create a magnetic field of sufficient strength to overcome the energy barrier of magnetoresistive memory cell 304 and thus switch the magnetic moment vector for magnetoresistive memory cell 304. For example, in one embodiment a 50 mA current 1002 is generated in high permeability conductive line 302. BL2 can be left floating through this operation.

Figure 5:
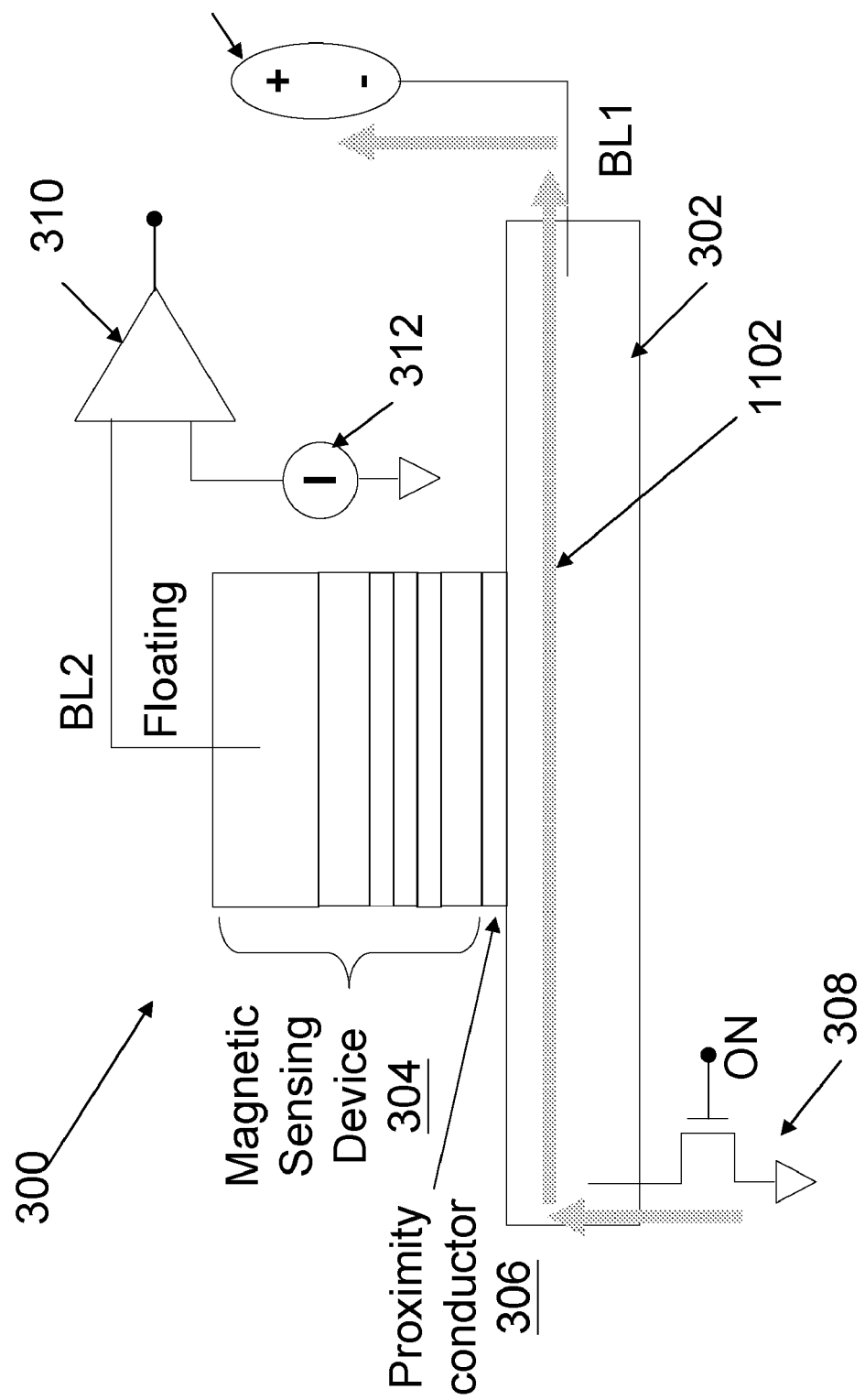
FIG. 5 is a diagram illustrating a writing operation in which the magnetoresistive memory cell of FIG. 4 is programmed to the other state.

FIG. 5 is a diagram illustrating a writing operation in which magnetoresistive memory cell 304 is programmed to the other state. Here the operation is similar to the operation depicted and described in relation to FIG. 4; however, the voltage difference applied to the other side of magnetic metal layer 302 via BL1 can be the opposite of the voltage difference applied in the process described in relation to FIG. 4. This will cause a writing current 1102 to flow in the opposite direction in high permeability conductive line 302 switching the magnetic moment vector of magnetoresistive memory cell 304 and programming magnetoresistive memory cell 304 to the other state. BL2 can be left floating through this operation. Again, in one example embodiment a 50 mA current 1102 can be generated in order to program magnetoresistive memory cell 304 to the other state.

As can be seen, not only does MRAM device 300 include a single current line 302, it also eliminates the need for, and complexity associated with, having separate read and write paths through the cell.

Figure 6:
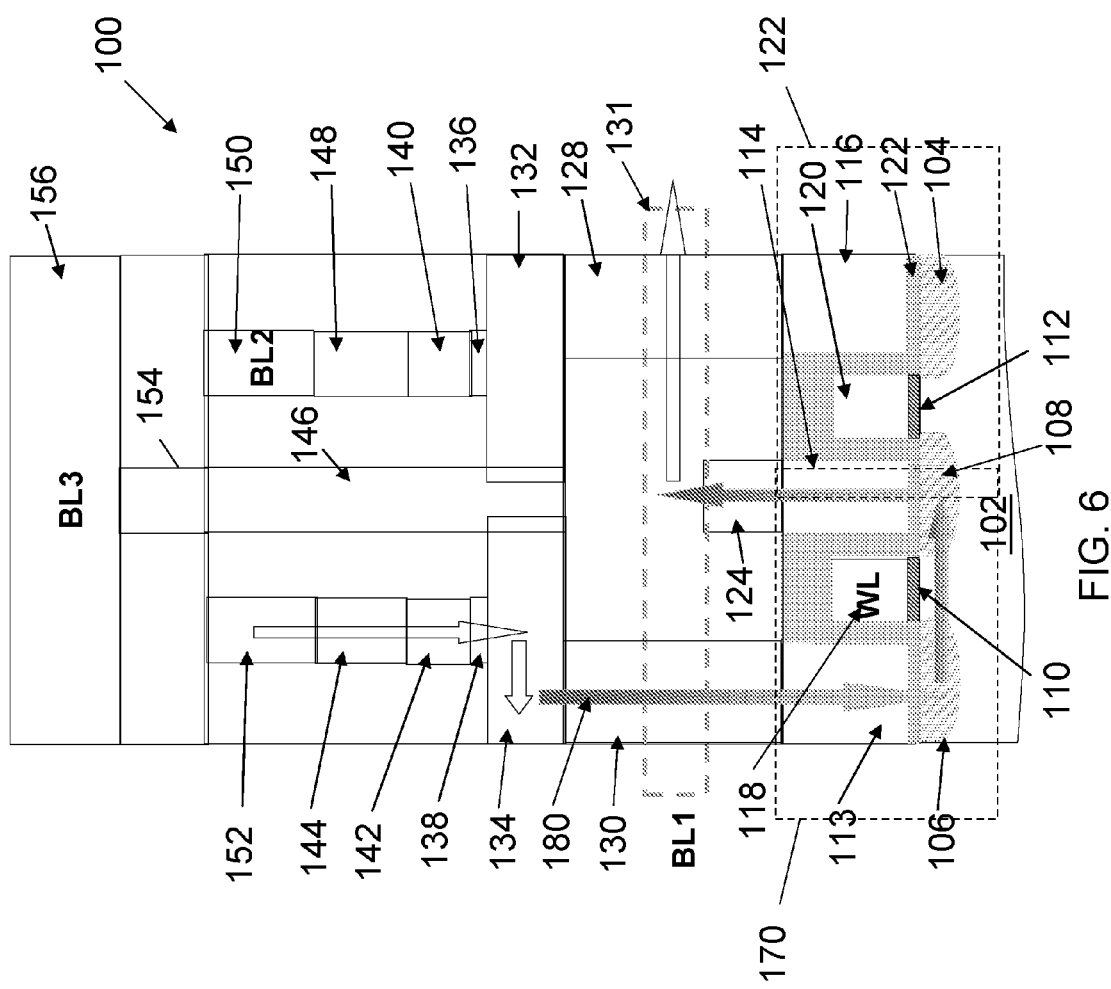
FIG. 6 is a diagram illustrating an example method for reading the state of a magnetoresistive memory cell included in the MRAM device of FIG. 1 in accordance with one embodiment.
Figure 7:
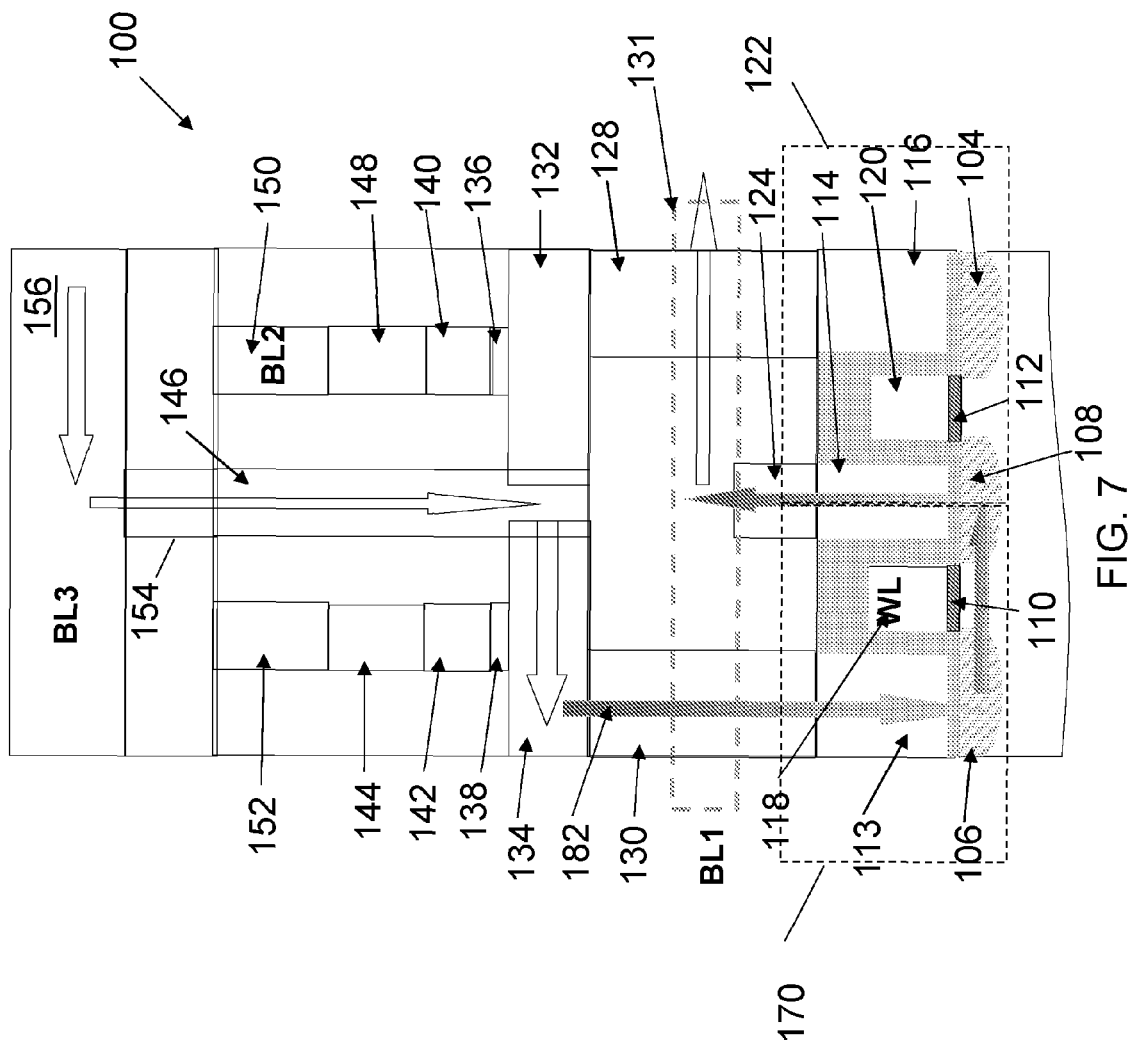
FIG. 7 is a diagram illustrating an example method for programming a magnetoresistive memory cell included in the MRAM device of FIG. 1 to a first state in accordance with one embodiment.
Figure 8:
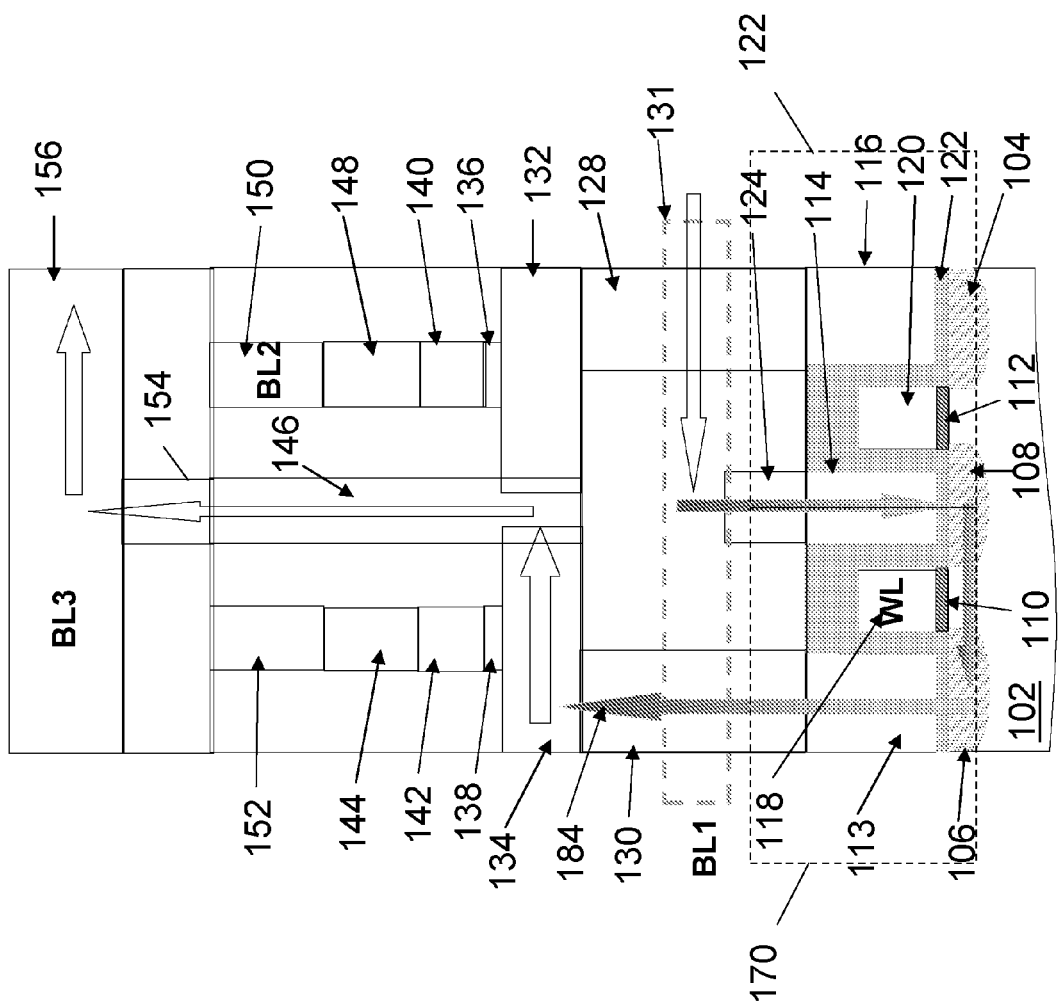
FIG. 8 is a diagram illustrating an example method for programming the magnetoresistive memory cell of FIG. 1 to a second state in accordance with one embodiment.

As with device 300 of FIG. 3, MRAM device 100 with respect to FIGS. 6-8 can comprise two MRAM structures 172 and 174 comprising magnetoresistive memory cells 140 and 142, separated from high permeability conductive lines 132 and 134 by proximity conductors 136 and 138, respectively. As explained below, magnetoresistive memory cells 140 and 142 can be read and written to using methods similar to those described with respect to FIGS. 3-5.

High permeability conductive lines 132 and 134 can have a permeability ($\mu$) in the range from about 10 to $10^8$ Henries per meter (H/m) or Newtons per ampere squared (N/A$^2$). High permeability conductive lines 132 and 134 can have a resistivity ($\rho$) that ranges from about 4□Ω-cm to 108 □Ω-cm. High permeability conductive lines 132 and 134 can also have a saturation magnetization (MS) that ranges from about 10 Gauss to 2.5 Tesla. The material used to construct high permeability conductive lines 132 and 134 can include at least one element with a crystallization phase. For example, high permeability conductive lines 132 and 134 can include elements of Ni, Fe, Co, B, Mo, Zn, Pb, Si, C, 0, and/or any other material that can provide the $\rho$ and MS described above.

Proximity conductors 136 and 138 can be configured to connect magnetoresistive memory cells 140 and 142 and high permeability conductive lines 132 and 134. The resistivity ($\rho$) of proximity conductors 136 and 138 can be in the range of about 2 to $10^{10}$ μΩ-cm. Proximity conductors 136 and 138 can be metal, a conductive compound, semi-conductor material, or any other material that has a resistivity within the range described above. These materials can include, for example, Cu, TiN, TaN, Si, W, Ag, Ru, Ir, Pt, etc.

Magnetoresistive memory cells 140 and 142 can include a single or multi-layer ferro/anti-ferro magnetic device. Such magnetoresistive memory cells can include, for example, a Magnetic Tunnel Junction (MTJ) device, a Giant Magneto Resistance (GMR) device, a Colossal Magneto Resistance (CMR) device, or an Anisotropic Magneto Resistance (AMR) device, Magneto Optical (MO) element, or magnetic disc. For example, magnetoresistive memory cells 140 and 142 can include an MTJ device comprising of a ferromagnetic layer, an insulator, another ferromagnetic layer, and an anti-ferromagnetic layer. Alternatively, magnetoresistive memory cells 140 and 142 can include an MTJ device that includes a ferro magnetic layer, an insulator layer, and another ferromagnetic layer, or an MTJ device that includes an anti-ferromagnetic layer, a ferromagnetic layer, an insulator, and another ferro magnetic layer.

In other embodiments, magnetoresistive memory cells 140 and 142 can include a GMR device that includes a ferromagnetic layer, a thin conductive layer, another ferromagnetic layer, and an anti-ferromagnetic layer. Alternative GMR devices that can be used in conjunction with the systems and methods described herein can include a ferromagnetic layer, a thin conductive layer, and another ferromagnetic layer, or an anti-ferromagnetic layer, a ferromagnetic layer, a thin conductive layer, and another ferromagnetic layer.

Alternatively, a CMR device comprising a Mn-based compound with at least two elements, such as LaSrMnO, PrCaMnO, LaCaMnO, etc., can be used for magnetoresistive memory cells 140 and 142. In still other embodiments, an AMR device, MO elements, or a magnetic disc comprising 3d transition ferromagnetic elements or alloys with other elements can be used for magnetoresistive memory cells 140 and 142.

The ferromagnetic layers referred to above can, depending on the embodiment, include 3d transition ferromagnetic elements or alloys with other elements such as CoFe, NiFe, CoFeB, Fe, Co, etc. The anti-ferromagnetic layers described above can include transition anti-ferromagnetic elements or alloys with other elements, such as FeMn, IrMn, NiO, PtMn, NiMn, CoO, etc. Other anti-ferromagnetic layers referred to above can include ferromagnetic multi-layers with or without anti-ferromagnetic material, such as CoFe/Ru/CoFe, CoFe/Ru/CoFe/IrMn, etc. Insulator layers referred to above can include elements such as Al2O3, MgO, etc., and the thin conductive layers described above, can include materials such as Cu, Ag, Cr, Ru, Ir, etc.

It will be understood that the devices, layers, and materials described above are by way of example only and should not be seen as limiting the systems and methods described herein to any particular device structure and/or materials. Further, the high permeability conductive element, or line can comprise a non-circular cross section. This allows the magnetic field to pass from one side of the high permeability element to the other. For example, the cross-sectional area can be polygon shape.

The magnetoresistive memory cell can then be located in a region between the neighboring two corners, or left and right edges of the high permeability conductive line.

FIGS. 3-5 illustrate how a magnetoresistive memory cell can be read and written to using a single high permeability conductive line using a common read and write path. Co-pending patent application Ser. No. 11/281,027 describes how to construct MRAM devices that use a single transistor and a diode under the magnetoresistive memory cell to perform the reading and writing of the cell in a manner that will allow the device to be constructed with less metal bit lines. Such a structure can make the MRAM device less expensive, and with tunable writing performance, which can reduce the size and/or increase the density of the MRAM device. Further, very low currents can be used for reading and writing operations, which enables portable applications, and as mentioned above can eliminate cross-talking issues.

MRAM device 100 also uses a single transistor to read and write to magnetoresistive memory cells 140 and 142 and can, therefore, provide the same benefits; however, in MRAM device 100, the need for a diode under the magnetoresistive memory cell can be eliminated, which can lead to an even further reduction in device size and, therefore, greater device densities. In fact, using the systems and methods described herein, feature sizes can be reduced to approximately 10F2. The greater device density, smaller size, and low current capability make deice 100 ideal for portable products.

MRAM device 100 comprises a substrate 102 onto which source regions 104 and 106 and drain region 108 have been implanted. Source region 102 and drain region 108 form the source and drain for transistor 168. Similarly, source region 106 and drain region 108 comprise a source and drain region for transistor 170. Gate electrodes 110 and 112 can then be deposited on substrate 102 over source regions 102 and 106 and drain region 108 as illustrated. Word lines 118 and 120 can then be formed on top of gate electrodes 110 and 112, respectively.

A source contact 130 can then be formed and coupled with source region 106 via contact hole 112. Similarly, source contact 128 can be formed and coupled with source region 104 via contact hole 116. Drain contact 124 can also be formed and coupled with drain region 108 via contact hole 114.

A dielectric, or oxide layer 126 can then be deposited over word lines 118 and 120 and drain contact 124 as illustrated. A metal bit line (BL1) 132 can then be formed and coupled with drain contact 124 as illustrated. High permeability conductive lines 132 and 134 can then be formed above oxide layer 126 and coupled with source contacts 130 and 131, respectively.

Proximity conductors 136 and 138 can then be formed on top of high permeability conductive lines 132 and 134. Magnetoresistive memory cells 140 and 142 can then be formed above proximity conductors 136 and 138, respectively. Vias 144, 146 and 148 can then be formed in dielectric, or oxide layers 156, 158, 160, and 162. Vias 144, 146, and 148 can be referred to as Via 1 vias. Bit lines (BL2) 150 and 152 can then be formed and coupled with magnetoresistive memory cells 140 and 142, respectively, through vias 148 and 144.

Via 154 can then be formed in dielectric, or oxide layers 166 and 164. Via 154 can be referred to as a Via 2 via. Bit line (BL3) 156 can then be formed on top of oxide layers 166 and 164 and coupled with high permeability conductive lines 132 and 134 through via 154 and via 146.

Bit lines 131, 150, 152, and 156, as well as word lines 118 and 120, can then be used to access the appropriate magnetoresistive cell in order to read and/or write the state of the magnetoresistive memory cell. FIGS. 6-8 illustrate example method for reading and writing state of magnetoresistive memory cell 142. It will be clear, however, that similar methods can be use in order to read and write the state of magnetoresistive memory cell 140 as well as other magnetoresistive memory cells included in device 100.

FIG. 6 is a diagram illustrating an example method for reading the state of magnetoresistive memory cell 142 in accordance with one embodiment of the systems and methods described herein. First, a read voltage is applied to word line 118. The read voltage applied the word line 118 should be higher than the turn on threshold voltage for transistor 170. For example, in one embodiment, a read voltage of approximately 1.5 V can be applied to word line 118. A voltage difference can then be applied between bit line 131 and bit line 152. For example, in one embodiment, a voltage difference of approximately 0.7 V can be applied between bit line 131 and bit line 152.

The voltage difference between bit lines 131 and 152 causes a sensing current 180 to flow from bit line 152 through magnetoresistive memory cell 142 and into high permeability conductive line 134 via proximity conductor 138. Current 180 then flows down to source region 106 through source contact 130 and contact hole 113. Because transistor 170 is turned on via the read voltage applied to word line 118, current 180 will then flow from source region 106 to drain region 108 and up to drain contract 124 through via contact hole 114. Current 180 will then flow out of bit line 131 where it can be sensed, e.g., using a sense amplifier.

During the read operation illustrated in FIG. 6, word line 120 can be tied to a 0 voltage or a slightly negative voltage. For example, in one embodiment, approximately −1 V is applied to word line 120 during a read operation for magnetoresistive memory cell 142. Further, bit line 156 can be allowed to float during the read operation.

It should also be noted that due to the orthogonal alignment of bit lines 150 and 152 relative to bit line 156, signal noise created during the read operation of magnetoresistive memory cell 142 should be significantly reduced relative to other MRAM structures such as MRAM structure 172.

FIG. 7 is a diagram illustrating an example method for programming magnetoresistive memory cell 142 to a first state in accordance with one embodiment of the systems and methods described herein. As with the process of FIG. 6, magnetoresistive memory cell 142 can be written by first applying a write voltage to word line 118. This write voltage should be high enough to exceed the turn on threshold for transistor 170.

For example, in one embodiment, a write voltage of approximately 1.5 V is applied to word line 118. A voltage difference can then be applied between bit line 156 and bit line 131. For example, in one embodiment, a voltage difference of approximately 1 V is applied between bit line 156 and bit line 131. This voltage difference will cause a write current 182 to flow from bit line 156 to high permeability conductive line 134 through vias 154 and 146. Current 182 can then flow down to source region 106 through source contact 130 and contact hole 113. Because transistor 170 is turned on, the current will flow from source region 106 to drain region 108 and up to drain contact 124 through contact hole 114. Current 182 would then flow out of bit line 131 as illustrated. Current 182 flowing in high permeability conductive line 134 will create a magnetic field of sufficient strength to overcome the energy barrier of magnetoresistive memory cell 142, which will cause the magnetic moment vector for magnetoresistive memory cell 142 to switch into the appropriate state.

During the write operation illustrated in FIG. 7, word line 120 can be tied to 0 V_or to a slightly negative voltage. For example, in one embodiment, approximately −1 V can be applied to word line 120 during the write operation. Additionally, bit lines 150 and 152 can be allowed to float during the write operation.

FIG. 8 is a diagram illustrating an example method for writing the state of magnetoresistive memory cell 142 to the other state in accordance with one embodiment of the systems and methods described herein. As with the process of FIG. 7, a write voltage sufficient to overcome the turn on threshold voltage for transistor 170 can be applied to word line 118. For example, in one embodiment, a write voltage of approximately 1.5 V can be applied to word line 118. A voltage difference can then be applied between bit line 156 and bit line 131. In this case, however, the voltage difference can be of an opposite polarity relative to the voltage difference applied in relation to the process of FIG. 7.

Thus, in one embodiment, a voltage difference of approximately −1V can be applied between bit line 156 and bit line 131. This will cause a write current 184 to flow from bit line 131 into drain region 108 through drain contact 124 and contact hole 114. Because transistor 170 is turned on, current 184 will flow from drain region 108 to source region 106 and up to high permeability conductive line 134 through contact hole 113 and source contact 130. Current 184 will then flow from high permeability conductive line 134 to bit line 156 through vias 146 and 154. Again, current 184 flowing in high permeability conductive line 134 will be sufficient to switch the magnetic moment vector of magnetoresistive memory cell 142 from its previous state.

Word line 120 can be tied to 0 or a slightly negative voltage, e.g., approximately −1V. Bit lines 150 and 152 can be allowed to float during the operation.

Thus, as can be seen, a single transistor can be used to read and write the state of magnetoresistive memory cell 142. Further, a single conductive line 134 can be used to program the state of magnetoresistive memory cell 142. This can allow for high density MRAM devices that use low current for reading and writing.

FIGS. 9 through FIG. 16 are diagrams illustrating an example process for fabricating MRAM device 100 in accordance with one embodiment of the systems and methods described herein. FIG. 9 illustrates a cross-sectional and corresponding top view of the initial layers formed during the fabrication process of MRAM device 100. As can be seen, word lines or gate structures 118 and 120 can be formed on substrate 102. First, however, an orientation axis can be selected for the formation of gate structures 118 and 120. For example, in the embodiment illustrated in FIG. 9, the y-direction has been chosen for the axis of orientation for gate structures 118 and 120. The formation of gate structures 118 and 120 can be accomplished in accordance with general semiconductor processes. For example, a n+ or p+ doped polysilicon material with metal silicide can be formed on substrate 102. The metal silicide can, for example, include $WSi_x$, $TiSi_x$, $CoSi_x$, $NiSi_x$, etc.

Depending on the embodiment, a dielectric hard mask may or may not be used to form the word line pattern. Further, a gate oxide 110 and 112 can be formed between polysilicon material comprising word lines 118 and 120, respectively. Gate oxides 110 and 112 can have a thickness less than approximately 15 nm.

A silicon nitride layer 122 can then be deposited above the metal silicide, or above the dielectric hard mask. A silicon nitride liner can then be deposited again to form a conformal silicon nitride film. The silicon nitride layer can be used as the stop layer for contact etching processes to be performed subsequently. Silicon nitride layer 122 can, depending on the embodiment, have a thickness in the range of approximately 20 nm to approximately 200 nm.

A dielectric oxide layer 186, such as HDP, BPSG, etc., can then be deposited over the structure. Dielectric oxide layer 186 can then be subjected to a chemical-mechanical-polish (CMP) process. The CMP process can stop at the surface of silicon nitride layer 122.

A line-shaped lithography, e.g., aligned in the x direction, can be used to form a contact mask in order to map out areas for contact hole formation.

FIG. 10 is a diagram illustrating the side and top views of the formation of contact holes 113, 114, and 116, and the formation of source regions 104 and 106 and drain region 108. A contact etch that has a high selectivity of oxide etching rate to silicon nitride can be used to form contact holes 113, 114, and 116. In certain embodiments, contact etching uses reactive-ion-etching technologies with chemistries of $C_4F_8$, Ar, $O_2$, $CF_4$, and/or $C_4F_6$, to name just a few of the possible chemistries. Based on the patterning of the contact holes, an n+ implantation such as As, P, $N_2$, etc., with energy in the range of about 5 keV to about 30 keV, with a wide angle range, can be used to form buried diffusion source/drain regions. A high temperature annealing process using temperatures in the range of about 900° C. to about 1200° C. can then be used to activate the buried diffusion implant to form the source/drain regions of transistors 168 and 170.

A deposition process and CMP of areas 113, 114, and 116 can be used to form a tungsten (W)-plug, i.e., the contacts.

Before fill-in of the contacts, an adhesion layer and barrier layer, such as Ti or TiN, can be deposited.

FIG. 11 is a diagram illustrating the top view and cross sectional views along lines AA' and BB' for the formation of the first inter-layer dielectric (ILD), drain contact, and BL1. The first ILD can, depending on the embodiment, be an oxide formed on the surface of the areas defining contact holes 113, 114 and 116. The first ILD can also cover the surface of the remainder of oxide layer 186 and silicon nitride layer 122.

Drain contacts can then be formed to connect the W-plug over drain region 108. The drain contact can, depending on the embodiment, be elliptic. In other embodiments the drain contact can be of a rectangular shape. In the embodiment of FIG. 11, two elliptical drain contacts aligned in the y direction are shown in the top view. One of these contacts, drain contact 124, is shown in each of the views for reference.

After the drain contacts are formed, a metallic bit line 131 can be formed along the x direction, and connected with the drain contacts. Depending on the embodiment, bit line 131 can comprise TiN, W, Ti/TiN, TaN, n+ doped polysilicon, or some other conductive material.

In certain embodiments, a silicon nitride layer is deposited above bit line 131, or above the dielectric hard mask for bit line 131 if a hard mask is used. This is similar to the formation of silicon nitride layer 122. Silicon nitride liner 188 can be deposited again to form a conformal silicon nitride film. Silicon nitride layer 188 is used as the etch stop material for a later self-aligning source contact etch process.

FIG. 12 is a diagram illustrating an example process for the formation of a second ILD layer and for the formation of the source contacts. FIG. 12 illustrates a top view as well as cross-sectional views along the lines CC' and DD'. The second ILD layer can comprise an oxide and can be configured to converge on the surface of silicon nitride liner 188 associated with bit line 131. Source contacts, including source contact 130, can then be formed such that they connect with the W-plug associated with the correct source region, e.g., source region 106. Similar to the contact etch process, the contact etch process used to form a source contact can have a high selectivity of oxide etching rate to silicon nitride. The method used can, depending on the embodiment, use a reactive ion etch process with chemistries of $C_4F_8$, Ar, $O_2$, $CF_4$, $C_4F_6$, etc.

Due to the self-aligned source contact, the overall size of an MRAM structure, e.g., MRAM structure 172 can be reduced. It will be understood that the silicon nitride liners associated with the bit lines aids in this process. For example, in the y direction, feature size of an MRAM cell configured in accordance with the systems and methods described herein can be lower than 3 F, i.e., source contact+bit line+space of drain contact. Further, the x direction feature size can range from 6 to 7 F. Thus, the feature size of an MRAM structure, such as MRAM structure 172 can range from 9 $F^2$ to 10.5 $F^2$. As mentioned, the decreased feature size can lead to increased densities and smaller structures, which can be beneficial particularly for portable applications.

Figure 13:
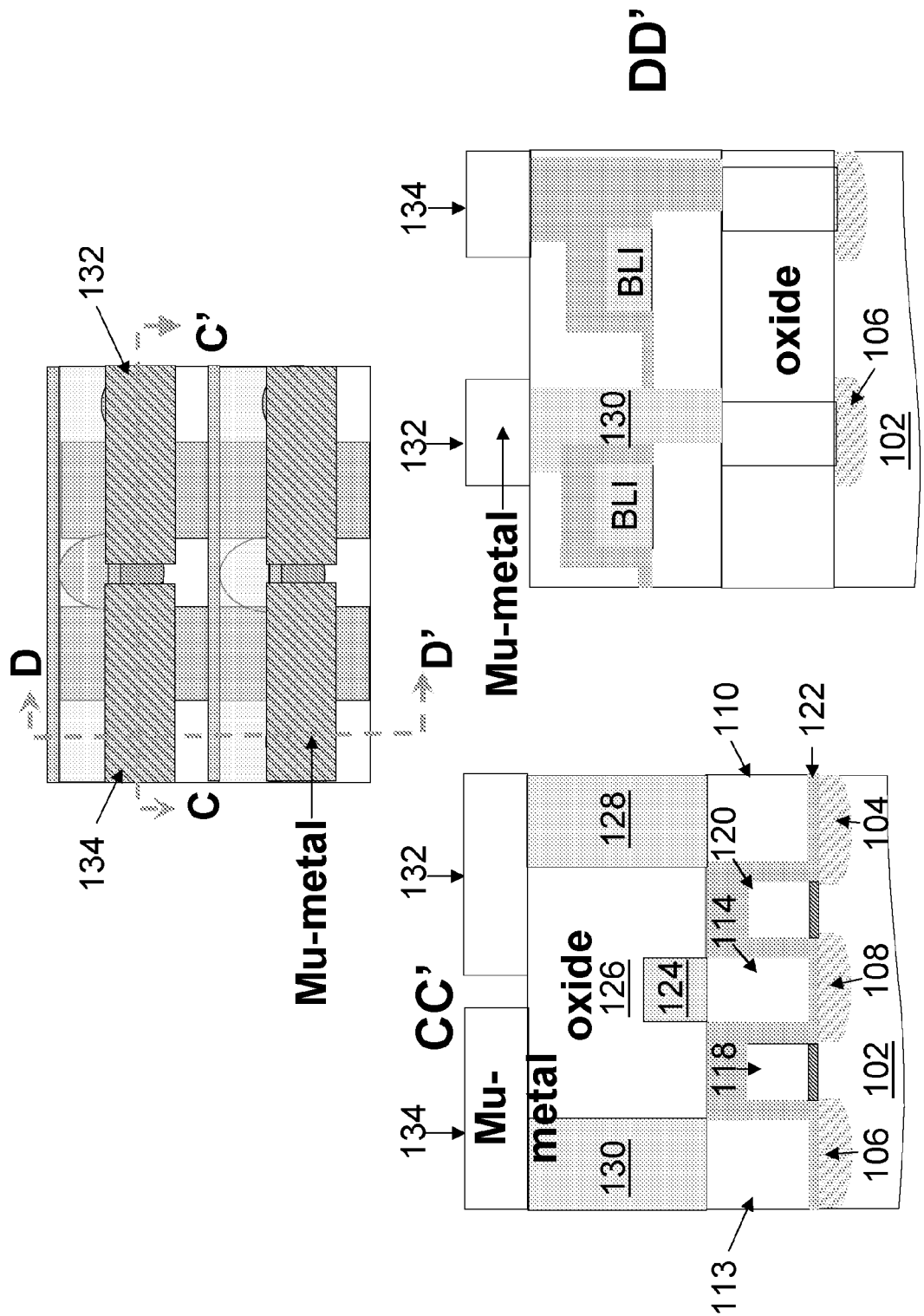

FIG. 13 is a diagram illustrating the process of forming the high permeability conductive lines, such as high permeability conductive lines 132 and 134. FIG. 13 illustrates a top view and cross sectional views along the lines CC' and DD'. The metal forming lines 132 and 134 can be deposited on a flat surface that can be treated by CMP so that the surface of the metal comprising lines 132 and 134 is also flat. The metal can be patterned to be, e.g., elliptic or rectangular in shape along the end, and aligned along the x-axis as illustrated in FIG. 13. The high permeability conductive lines can be configured so that they are connected to the correct source contact.

Design constraints, such as the minimum space between high permeability conductive lines must be adhered to. For example, the minimum space between high permeability conductive lines can, depending on the embodiment, be within the range of approximately 30 nm to approximately 300 nm.

Figure 14:
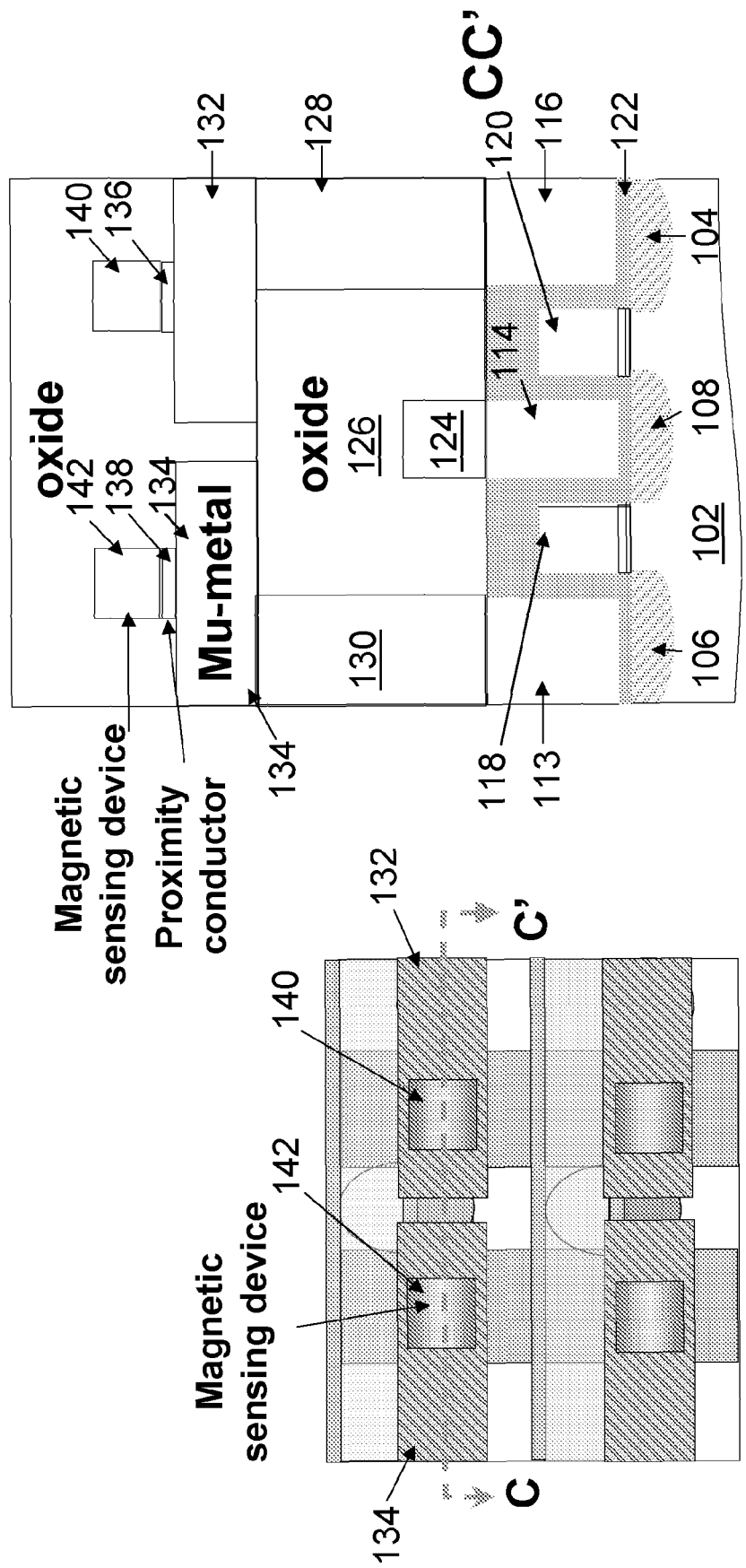

FIG. 14 is a diagram illustrating the formation of magnetoresistive memory cells, such as magnetoresistive memory cells 140 and 142. Depending on the embodiment, the magnetoresistive memory cells and the associated proximity conductors, e.g., proximity conductors 136 and 138, can be simultaneously patterned in an island shape with a landing near the center position of the flat high permeability conductive line metal surface. As mentioned, the proximity conductors are used to connect the magnetoresistive memory cells with the high permeability conductive lines.

After the magnetoresistive memory cells and proximity conductors are patterned, a dielectric layer 194 can be deposited over the magnetoresistive memory cells.

Figure 15:
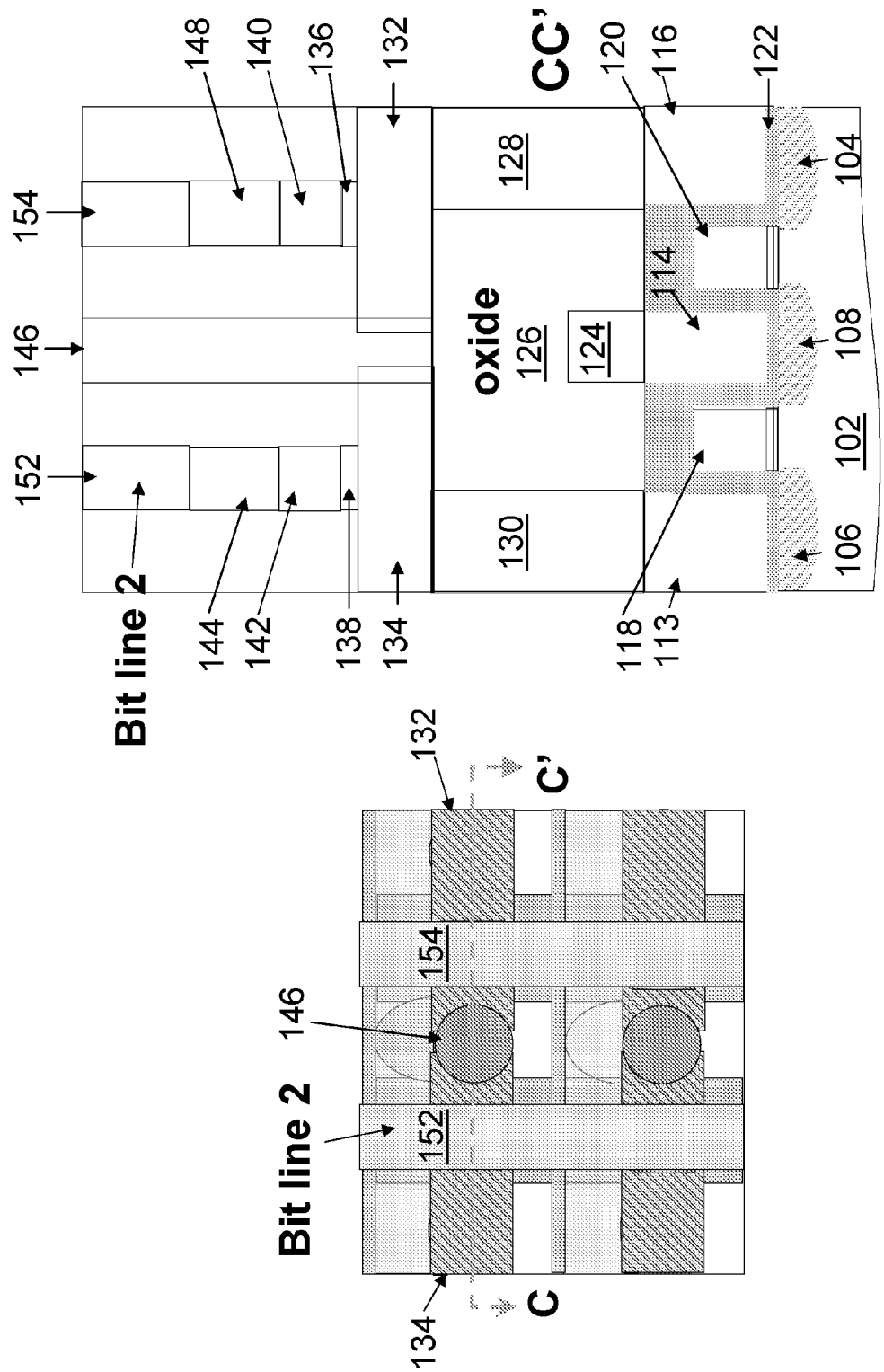

FIG. 15 is a diagram illustrating an example process for the formation of the Via1 patterns and BL2 patterns. FIG. 15 illustrates a top view and a cross-sectional view along line CC', the Via1 patterning is performed such that vias landing on the magnetoresistive memory cells and vias landing on the edge of the high permeability conductive lines are formed either simultaneously or asynchronously. In embodiments where the vias are formed asynchronously, the vias landing on the magnetoresistive memory cells and the vias landing on the edge of the high permeability conductive lines are separately patterned. For example, the vias landing on the edge of the high permeability conductive lines can be patterned first, e.g., with an x-pitch of approximately 6 to 7 F and a y-pitch of approximately 3 F. The vias landing on the magnetoresistive memory cells, can then be patterned, e.g., with an x-pitch of approximately 3 to 4 F and a y-pitch of approximately 3 F.

In embodiments where the vias are formed simultaneously, the vias landing on the magnetoresistive memory cells, and the vias landing on the edge of the high permeability conductive lines can be patterned at the same time. For example, the patterning can use an x-pitch of approximately 6 to 7 F per 3 vias with dual pitch, the y-pitch can be approximately 3 F.

After the vias are formed, the BL2 lines that connect with the magnetoresistive memory cells through the Via1 vias can be formed. BL2 and Via1 formation can be performed using a dual damascene process with Cu or W fill-in simultaneously. Alternatively, a BL2 and Via 1 formation can be performed using a traditional W-plug and TiN/AlCu/TiN metal line process.

Figure 16:
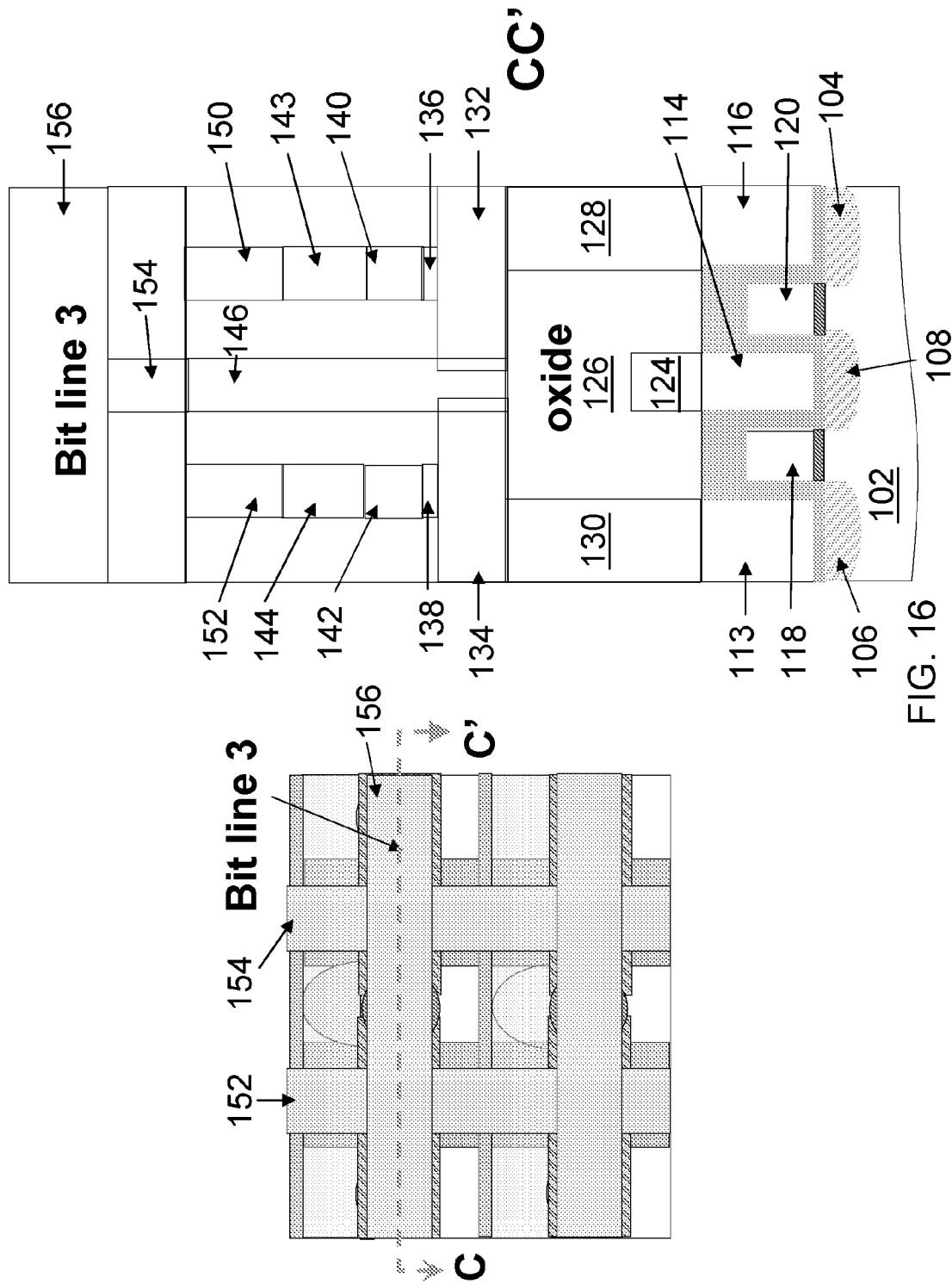

FIG. 16 is a diagram illustrating the Via 2 pattern formation and the BL3 pattern formation. FIG. 16 illustrates a top view and a cross-sectional view along the lines CC'. The BL3 lines connect with the high permeability conductive lines through the Via 2 vias and the Via 1 vias as illustrated. BL3 and Via 2 formation can be performed using a dual damascene process using Cu or W fill-in simultaneously. Alternatively, the BL3 and Via 2 formation can be performed using traditional W plug and TiN/AlCu/TiN metal line process.

It will be clear from the figures and associated descriptions above that the processes described can be used to fabricate an MRAM device comprising any number of MRAM structures. Further, the MRAM structures can be formed in an array of any size. Accordingly, the structures and processes described above should not be seen as limiting the invention to any particular embodiments, structures, arrays, or number of MRAM structures per MRAM device.

By configuring MRAM cells in accordance with the systems and methods described herein, MRAM devices can be made amenable for portable non-volatile memory applications. Further, such MRAM devices can provide high reliability as well as high density. MRAM cells configured in accordance with the systems and methods described herein result in easier to fabricate devices that reduce cost and can reduce size constraints.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. An MRAM device, comprising:
   a high permeability conductive element;
   a magnetoresistive memory cell separated from the high permeability conductive element by a proximity conductor;
   a word line transistor comprising a gate, a source region, and a drain region, the source region coupled with one end of the high permeability conductive element;
   a word line coupled with the gate of the word line transistor;
   a first bit line communicatively coupled with the drain region of the word line transistor and substantially perpendicular to the word line; and
   a second bit line substantially parallel with the word line and electrically coupled with the source region through the magnetoresistive memory cell.

2. The MRAM device of claim 1, further comprising a third bit line coupled with the other end of the high permeability conductive element.

3. The MRAM device of claim 2, further comprising a second high permeability conductive element adjacent to the first high permeability conductive element, word line coupled with the gate of the word line transistor, wherein both of the high permeability conductive elements are coupled with the third bit line.

4. The MRAM device of claim 1, wherein the word line transistor is used to access the magnetoresistive memory cell in order to both read and write the status of the magnetoresistive memory cell.

5. The MRAM device of claim 1, wherein current through the high permeability conductive element can be used to both read and write the state of the magnetoresistive memory cell.

6. The MRAM device of claim 1, wherein the high permeability conductive element comprises a material having a permeability ($\mu$) ranging from about 10 to $10^8$.

7. The MRAM device of claim 1, wherein the high permeability conductive element comprises a material having resistivity (r) ranging from about 4 mW-cm to $10^8$ mW-cm at operating temperatures.

8. The MRAM device of claim 1, wherein the high permeability conductive element comprises a material having a saturation magnetization (Ms) ranging from about 10 Gauss to about 2.5 Tesla.

9. The MRAM device of claim 1, wherein the high permeability element has a cross-sectional polygon shape.

10. The MRAM device of claim 1, wherein magnetoresistive memory cell is located in a region between the neighboring two corners of the high permeability conductive element.

11. The MRAM device of claim 1, wherein the high permeability conductive element comprises a material that includes at least one of the Ni, Fe, Co, B, Mo, Zn, Pb, Si, C, and 0.

12. The MRAM device of claim 1, wherein the magnetoresistive memory cell comprises a Magnetic Tunnel Junction (MTJ) device, a Giant Magnetoresistance (GMR) device, a Colossal Magnetoresistance (CMR) device, Anisotropic Magnetoresistance (AMR) device, Magneto-optical (MO) element, or a Magnetic disk.

13. The MRAM device of claim 12, wherein the MTJ device comprises a first ferromagnetic layer, an insulating layer, and a second ferromagnetic layer.

14. The MRAM device of claim 13, wherein the MTJ device further comprises an antiferromagnetic layer adjacent the first or second ferromagnetic layer.

15. The MRAM device of claim 13, wherein the insulator of MTJ device can be Al2O3 or MgO.

16. The MRAM device of claim 12, wherein the GMR device comprises a first ferromagnetic layer, a thin conductive layer, and a second ferromagnetic layer.

17. The MRAM device of claim 16, wherein the GMR device further comprises an antiferromagnetic layer adjacent the first or second ferromagnetic layer.

18. The MRAM device of claim 1, wherein the proximity conductor has a resistivity ($\rho$) of about 2 to $10^{10}$ $\Omega$-cm.

19. The MRAM device of claim 1, wherein the proximity conductor is constructed from material that includes at least one of Cu, TiN, TaN, Si, W, Ag, Ru, Ir, and Pt.

20. An MRAM device, comprising:
   a high permeability conductive element;
   a magnetoresistive memory cell separated from the high permeability conductive element by a proximity conductor;
   a word line transistor comprising a gate, a source region, and a drain region, the source region coupled with one end of the high permeability conductive element;
   a word line coupled with the gate of the word line transistor;
   a first bit line communicatively coupled with the drain region of the word line transistor and substantially perpendicular to the word line; and
   a second bit line communicatively coupled with the magnetoresistive memory cell and the source region of the word line transistor through a current path that is present whether the word line transistor is on or off, the second bit line being substantially parallel with the word line.

21. An MRAM device, comprising:
   a high permeability conductive element;
   a magnetoresistive memory cell separated from the high permeability conductive element by a proximity conductor;
   a word line transistor comprising a gate, a source region, and a drain region, the source region coupled with one end of the high permeability conductive element;
   a word line coupled with the gate of the word line transistor;
   a first bit line communicatively coupled with the drain region of the word line transistor and substantially perpendicular to the word line; and
   a second bit line substantially parallel with the word line and coupled with the source region,
   wherein the magnetoresistive memory cell is between the second bit line and the source region.

* * * * *